United States Patent
Yeh (10) Patent No.: US 9,013,036 B2
(45) Date of Patent: Apr. 21, 2015

(54) SEALING MEMBER AND ELECTRONIC DEVICE USING THE SAME

(71) Applicant: Wistron Corp., New Taipei (TW)

(72) Inventor: Chih-Feng Yeh, New Taipei (TW)

(73) Assignee: Wistron Corp., New Taipei (TW)

( * ) Notice: Subject to any disclaimer, the term of this patent is extended or adjusted under 35 U.S.C. 154(b) by 106 days.

(21) Appl. No.: 14/024,535

(22) Filed: Sep. 11, 2013

(65) Prior Publication Data

US 2014/0126127 A1    May 8, 2014

(30) Foreign Application Priority Data

Nov. 6, 2012 (TW) ............................. 101141090 A (51) Int. Cl.
 *H01L 23/06* (2006.01)
 *H05K 5/06* (2006.01)
 *F15B 1/00* (2006.01)

(52) U.S. Cl.
 CPC ............ *H05K 5/06* (2013.01); *Y10T 428/24612* (2013.01); *F15B 1/00* (2013.01); *H05K 5/061* (2013.01)

(58) Field of Classification Search
 CPC ....... H05K 5/06; H05K 5/0095; H05K 5/061; H05K 5/065; H05K 5/069
 USPC .................. 275/710, 729, 730, 732; 428/172; 361/679.01
 See application file for complete search history.

(56) References Cited

U.S. PATENT DOCUMENTS

| | | | | |
|---|---|---|---|---|
| 4,015,745 | A * | 4/1977 | Petrangelo | 220/320 |
| 5,050,764 | A * | 9/1991 | Voss | 220/378 |
| 6,561,522 | B1 * | 5/2003 | Radelet et al. | 277/628 |
| 6,822,161 | B2 * | 11/2004 | Komatsu et al. | 174/367 |
| 6,921,089 | B2 * | 7/2005 | Groh et al. | 277/628 |
| 7,441,525 | B2 * | 10/2008 | Jessberger et al. | 123/90.37 |
| 8,164,899 | B2 * | 4/2012 | Yamaguchi et al. | 361/679.55 |
| 8,796,548 | B2 * | 8/2014 | Rost et al. | 174/50 |
| 8,833,772 | B2 * | 9/2014 | Sasaki et al. | 277/639 |

FOREIGN PATENT DOCUMENTS

| | | |
|---|---|---|
| CN | 101888757 A | 11/2010 |
| TW | M439929 U1 | 10/2010 |

OTHER PUBLICATIONS

Taiwan Patent Office, Office Action, Patent Application Serial No. 101141090, Nov. 27, 2014, Taiwan.

* cited by examiner

*Primary Examiner* — Cathy Lam (57) ABSTRACT

A sealing member is disclosed, which includes a first structure and a second structure. The first structure includes a groove with an opening towards the outside of the sealing member, wherein the second structure is disposed in the groove. The first structure includes a first material, and the second structure includes a second material, wherein the water absorption rate of the second material is greater than the water absorption rate of the first material. Also, an electronic device using the sealing member is disclosed.

10 Claims, 7 Drawing Sheets

SEALING MEMBER AND ELECTRONIC DEVICE USING THE SAME

CROSS REFERENCE TO RELATED APPLICATIONS

This Application claims priority of Taiwan Patent Application No. 101141090, filed on Nov. 6, 2012, the entirety of which is incorporated by reference herein.

BACKGROUND OF THE INVENTION

1. Field of the Invention

The present invention relates to a sealing member and electronic device using the same, and in particular, relates to a sealing member including two different materials and electronic device using the same.

2. Description of the Related Art

An electronic device, such as a mobile cell phone, normally comprises an upper housing member and a lower housing member for protecting the electronic elements disposed therein. For a waterproof electronic device, a rubber ring may further be disposed in between the upper and the lower housing members so as to seal a slit formed therebetween.

Since size reduction is a trend for electronic device, the mechanical strength of upper and the lower housing members have become relatively weak. To counteract this problem, assembly screws are decreased or no assembly screws are used for fastening the housing members for structural durability of the housing members. However, hydraulic sealing capability of electronic devices may be reduced accordingly, because of decreased stress applied on a sealing rubber ring from the housing members.

BRIEF SUMMARY OF THE INVENTION

In this regard, the main objective of the invention is to provide a sealing member, so that the hydraulic sealing capability of a device implementing the sealing member can be improved.

According to one of the embodiments, a sealing member comprises a first structure and a second structure. The first structure comprises a groove with an opening towards the outside of the sealing member, wherein the second structure is disposed in the groove. The first structure comprises a first material, and the second structure comprises a second material, wherein the water absorption rate of the second material is greater than the water absorption rate of the first material.

In one embodiment, the first structure circumferentially extends around an axis, and the first structure comprises an inner lateral surface and an outer lateral surface, and the inner lateral surface is closer to the axis than the outer lateral surface, and the groove is formed on the outer lateral surface.

In one embodiment, the groove penetrates the first structure to connect the inner lateral surface to the outer lateral surface.

In one embodiment, the groove surrounds the axis and extends along the outer lateral surface.

In one embodiment, the first structure comprises a plurality of grooves, and the grooves are arranged at the outer lateral surface and separated apart from each other.

In one embodiment, the second structure is deformable from a first configuration to a second configuration, in response to a moisture content thereof, and when the second structure is in the second configuration, a part of the second structure is outside of the groove, wherein the deformation of the second structure from the first configuration to the second configuration increases the width of the groove.

In one embodiment, the first material comprises silicon resin, and the second material comprises a water absorption sponge or water absorption fibers.

The various embodiments set forth herein may be implemented utilizing an electronic device. In some embodiments, the electronic device comprises a first housing member, a second housing member facing the first housing member and an operation module disposed in a space defined by the first housing member and the second housing member. The sealing member is pressed by the first and the second housing members so as to prevent the entrance of particles from outer surroundings, wherein the sealing member is disposed at a peripheral region of the space, and the first structure is closer to the space than the second structure.

BRIEF DESCRIPTION OF THE DRAWINGS

The present invention is more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
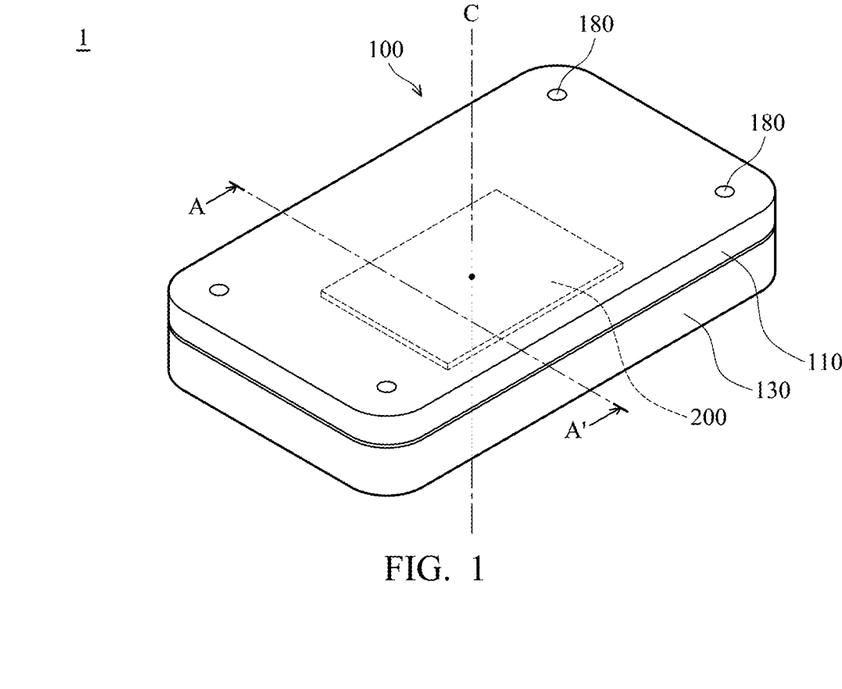
FIG. 1 illustrates a schematic view of an electronic device according to an embodiment of the invention.

Referring to FIG. 1, in accordance with an embodiment of the invention, an electronic device 1 includes a protective structure 100 and an operation module 200. In an embodiment, the electronic device 1 is a handheld mobile phone, wherein the operation module includes a circuit board, a display module, a speaking module and power, etc., and the operation module 200 is disposed in the protective structure 100.

Figure 2:
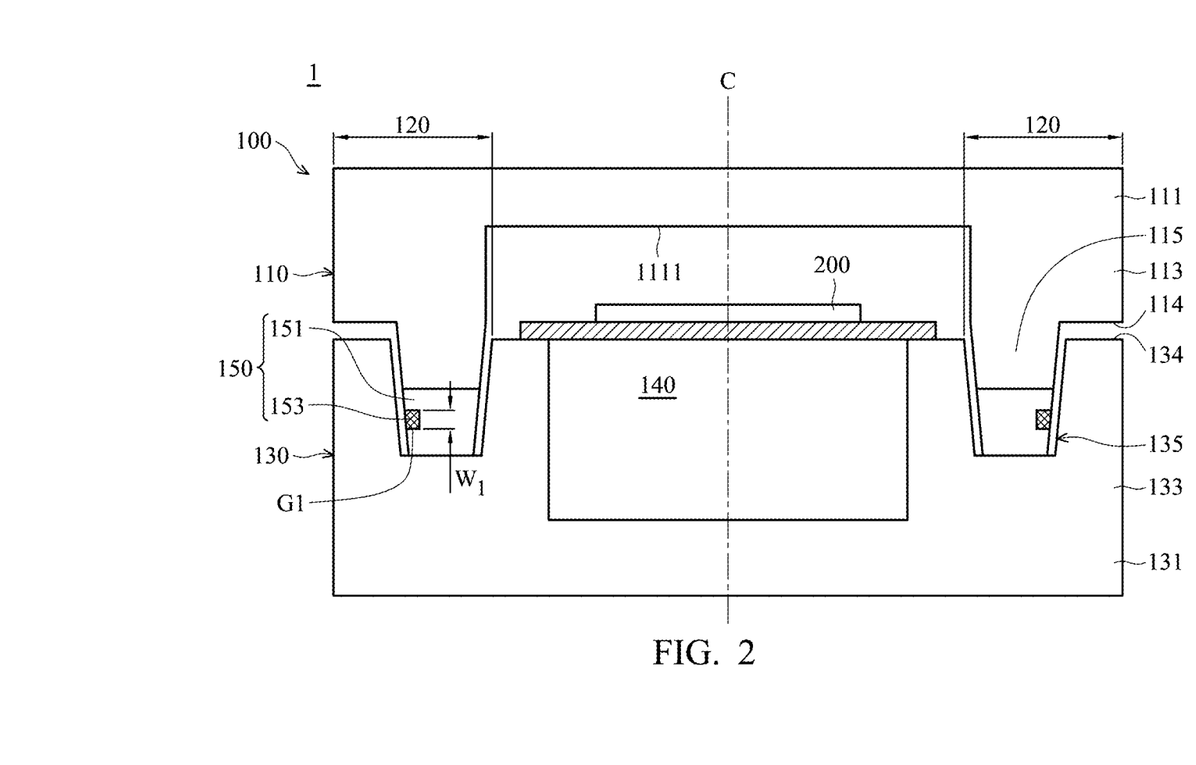
FIG. 2 is a cross-sectional view of the electronic device according to the embodiment of the invention taken along line A-A' of FIG. 1, wherein a second structure of a sealing member has a first configuration.

Referring to FIG. 2, which shows a cross-sectional view of the electronic device taken along line A-A' of FIG. 1, wherein a second structure 153 of a sealing member 150 has a first configuration. The protective structure 100 includes a first housing member 110, a second housing member 130 and a first sealing member 150. A space 140 inside of the protective structure 100 is defined by the first housing member 110 and second housing member 130.

The first housing member 110 includes an upper lid 111 and a first side wall 113. The first side wall 113 is formed as a single piece with the upper lid 111, wherein the first side wall 113 protrudes from the inner surface 1111 of the upper lid 111 and includes a first engaging potion 115 at the end surface 114 thereof.

The second housing member 130 faces the first housing member 110 and is assembled with the first housing member 110. In one embodiment, the first housing member 110 is assembled with the second housing member 130 via a screw 180 (FIG. 1), but it should not be limited thereto. The second housing member 130 includes a lower lid 131 and a second side wall 133. The second side wall 133 is formed as a single piece with the lower lid 131, wherein the second side wall 133 protrudes from the inner surface of the lower lid 131 and includes a second engaging portion 135 at the end surface 134 thereof. As shown in FIG. 2, a slit 120, disposed at a peripheral region of the space 140, is formed between the end surface 114 of the first side wall 113 and the end surface 134 of the second side wall 133.

In the embodiment, the first engaging portion 115 is an embossed flange, and the second engaging portion 135 is a recess, but it should not be limited thereto. The first engaging portion 115 and the second engaging portion 135 may be any suitable configuration which is compatible with the dimensions and functions of each other. For the purpose of illustration, in the following description, the embossed flange 115 refers to the first engaging portion, and the recess 135 refers to the second engaging portion.

Figure 3:
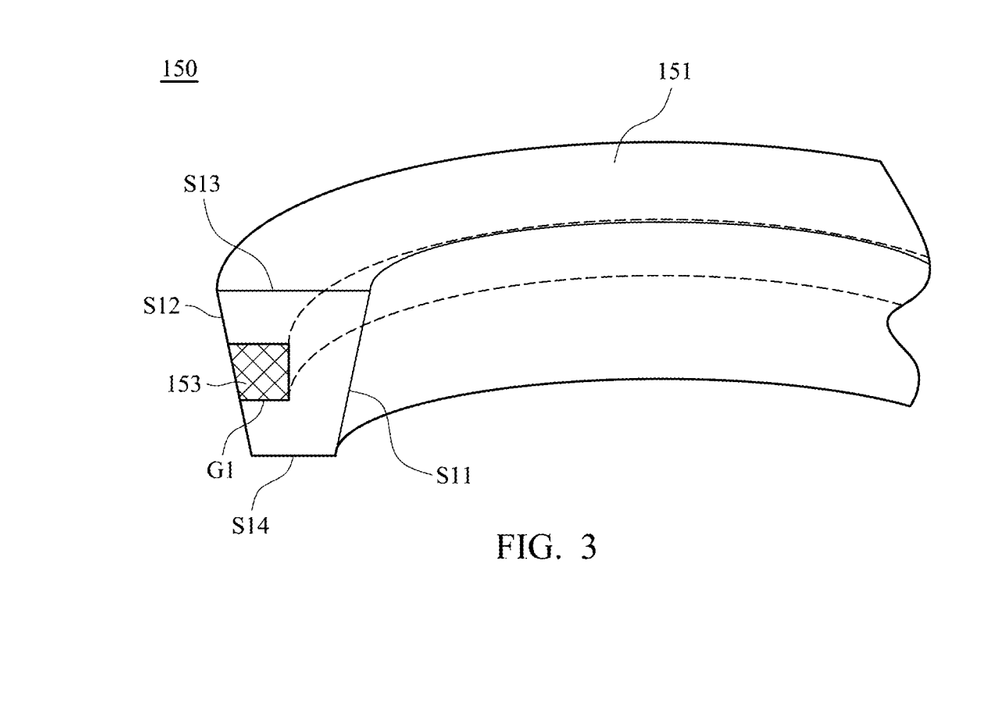
FIG. 3 illustrates a partial schematic view of the sealing member according to an embodiment of the invention.

The sealing member 150 is disposed in the recess 135 and includes a first structure 151 and a second structure 153 which is formed as a single piece with the first structure 151. The first structure 151 circumferentially extends around an axis C and has trapezoidal cross-section. Additionally, as shown in FIG. 3, the first structure 151 includes a cross-section having an outer circumference which includes an inner lateral surface S11, an outer lateral surface S12, an upper lateral surface S13 and a lower lateral surface S14, wherein the inner lateral surface S11 is closer to the axis C (FIG. 2) than the outer lateral surface S12, and the upper lateral surface S13 and the lower lateral surface S14 are connected between the inner lateral surface S11 and the outer lateral surface S12, respectively. A groove G1 is formed on the outer lateral surface S12 and opens towards the outside of the sealing member 150, wherein the groove G1 entirely surrounds the axis C (FIG. 2) and extends along the outer lateral surface S12 of the first structure 151, and the groove G1 has a width of $W_1$ (FIG. 2). In the embodiment, the first structure 151 is made of a first material. For example, the first structure 151 is made of material including silicon resin.

The second structure 153 is disposed in the groove G1 of the first structure 151, and the second structure 153 is made of a second material, wherein the second material has a water absorption rate which is greater than a water absorption rate of the first material. For example, the second structure 153 is made of material including a water absorption sponge or water absorption fibers.

Referring to FIGS. 1 and 2, the assembly process of the electronic device 1 is described in detail. In the first step, the operation module 200 is disposed in the first housing member 110 or the second housing member 130, and the sealing member 150 is inserted into the recess 135 of the second housing member 130. Next, the first housing member 110 is assembled with the second housing member 130 through the connection of the embossed flange 115 and the recess 135. At the same time, the sealing member 150 is compressed by the outer surfaces of the embossed flange 115 and the outer surfaces of the recess 135, thereby, sealing the slit 120. Through the mechanical features of the protective structure 100, moisture from the surroundings is blocked by the sealing member 150, so that the operation module 200 is protected from being damaged due to environmental factors.

Figure 4:
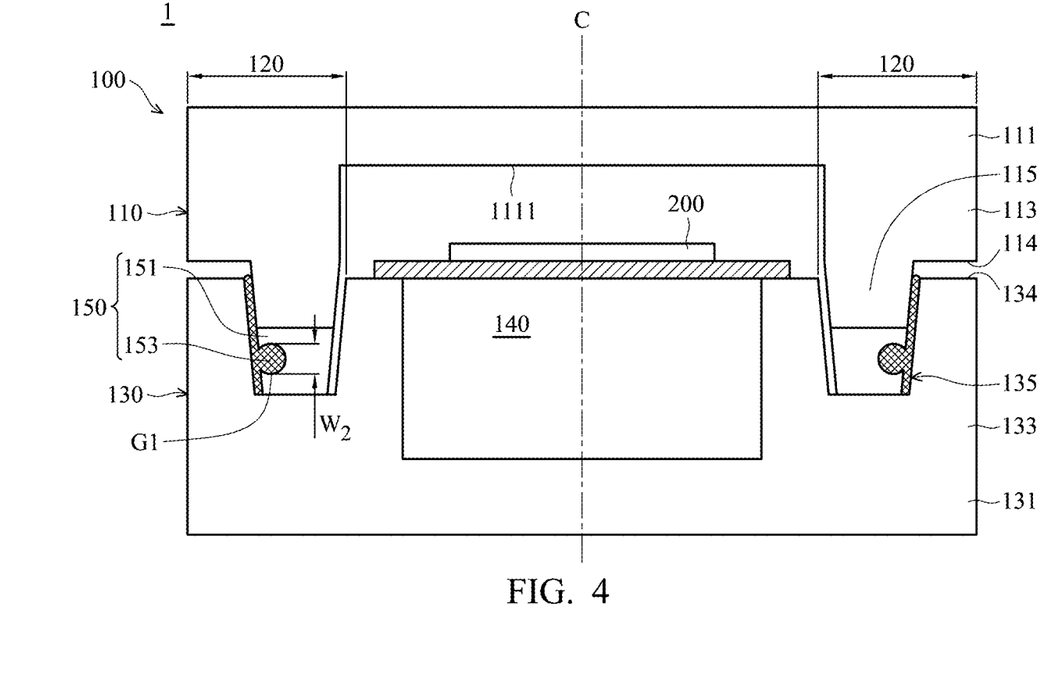
FIG. 4 is a cross-sectional view of the electronic device according to the embodiment of the invention taken along line A-A' of FIG. 1, wherein a second structure of a sealing member has a second configuration.

Referring to FIG. 4, which shows the schematic view of the electronic device 1, wherein the second structure 153 of the sealing member 150 has a second configuration. When the electronic device 1 is placed in a moist environment or immersed in water, moisture or water from the surroundings may enter the electronic device 1 via the slit 120. However, because of the second structure 153, which has a greater water absorption rate than the first structure 151, moisture or water from the surroundings is absorbed by the second structure 153 of the sealing member 150 prior to entrance to the space 140.

In addition, the second structure 153 of the sealing member 150 is deformable from a first configuration (FIG. 2) to a second configuration, (FIG. 4) in response to a moisture content thereof (i.e. the volume of the second structure 153 of the sealing member 150 increases after water absorption). The deformation of the second structure 153 from the first configuration to the second configuration may cause an expansion of the groove G1. Thus, the groove G1 is expanded from a width of $W_1$ to a width of $W_2$, wherein the width $W_2$ is larger than the width $W_1$.

The structural features of the sealing member of this invention can be modified based on user demands. In the description below, some exemplary embodiments of the sealing members 250, 350, 450, 550 and 650 will be illustrated.

Figure 5A:
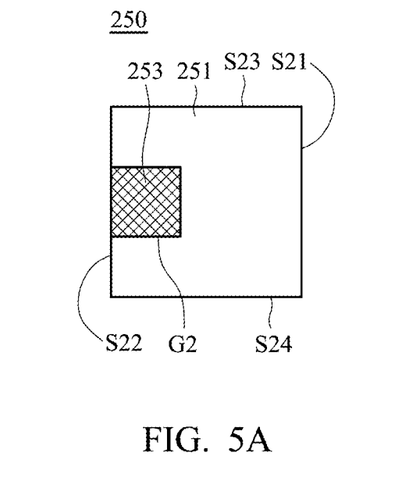
FIGS. 5A-5C are cross-sectional views of sealing members in accordance with various embodiments of the invention.

In an embodiment, as shown in FIG. 5A, a sealing member 250 includes a rectangular cross-section, and a first structure 251 thereof includes a cross-section having an outer circumference which includes an inner lateral surface S21, an outer lateral surface S22, an upper lateral surface S23 and a lower lateral surface S24, wherein the inner lateral surface S21 is opposite to the outer lateral surface S22, and the upper lateral surface S23 and the lower lateral surface S24 are connected between the inner lateral surface S21 and the outer lateral surface S22, respectively. A groove G2 is formed on the outer lateral surface S22 of the first structure 251, and a second structure 253 is disposed in the groove G2.

Figure 5B:
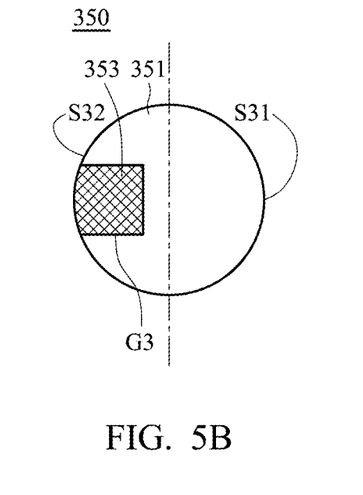

In other embodiments, as shown in FIG. 5B, a sealing member 350 includes a circular cross-section, and the first structure 351 thereof includes a cross-section having an outer circumference which includes an inner lateral surface S31 and an outer lateral surface S32, wherein both of the inner lateral surface S31 and the outer lateral surface S32 have a circumference which is a half of the total circumference of the first structure 351. A groove G3 is formed on the outer lateral surface S32 of the first structure 351, and a second structure 353 is disposed in the groove G3.

Figure 5C:
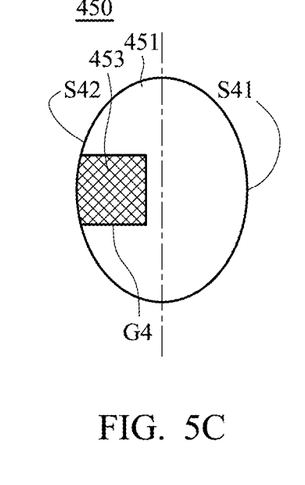

In an embodiment, as shown in FIG. 5C, a sealing member 450 includes an elliptical cross-section, and the first structure 451 includes a cross-section having an outer circumference which includes an inner lateral surface S41 and an outer lateral surface S42, wherein both of the inner lateral surface S41 and the outer lateral surface S42 have a circumference which is a half of the total circumference of the sealing member 450. A groove G4 is formed on the outer lateral surface S42 of the first structure 451, and a second structure 453 is disposed in the groove G4.

Figure 6:
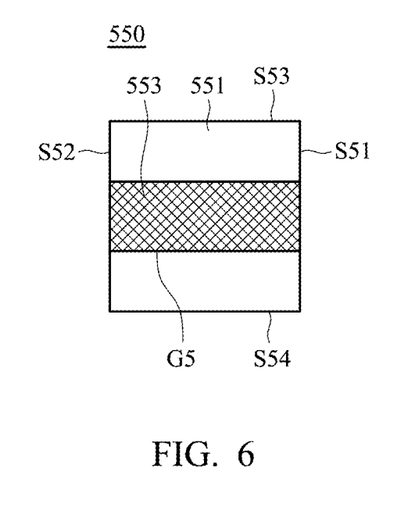
FIG. 6 is a cross-sectional view of a sealing member according to an embodiment of the invention.

In an embodiment, as shown in FIG. 6, a first structure 551 of a sealing member 550 includes a cross-section having an outer circumference which includes an inner lateral surface S51, an outer lateral surface S52, an upper lateral surface S53 and a lower lateral surface S54, wherein the inner lateral surface S51 is opposite to the outer lateral surface S52, and the upper lateral surface S53 and the lower lateral surface S54 are connected between the inner lateral surface S51 and the outer lateral surface S52, respectively. A groove G5 penetrates through the upper lateral surface S53 and the lower lateral surface S54 along a direction parallel with the extended direction of the upper lateral surface S53 and the lower lateral surface S54. Because the groove G5 has two openings exposed toward an outside of the sealing member 550, the two opposite sides of the second structure 553, which are adjacent to the inner lateral surface S51 and the outer lateral surface S52, may open towards the outside of the sealing member 550.

The advantages of the sealing member 550 are described hereinafter. Due to differences of the materials of the first structure 551 and the second structure 553, the deformations of the first structure 551 and the second structure 553 may be different once stresses are acted thereon. However, the extended direction of the first structure 551 and the second structure 553 is perpendicular to a direction of the stress, so that the sealing member 550 may deform uniformly, thereby, sealing the slit 120 (FIG. 1).

Figure 7:
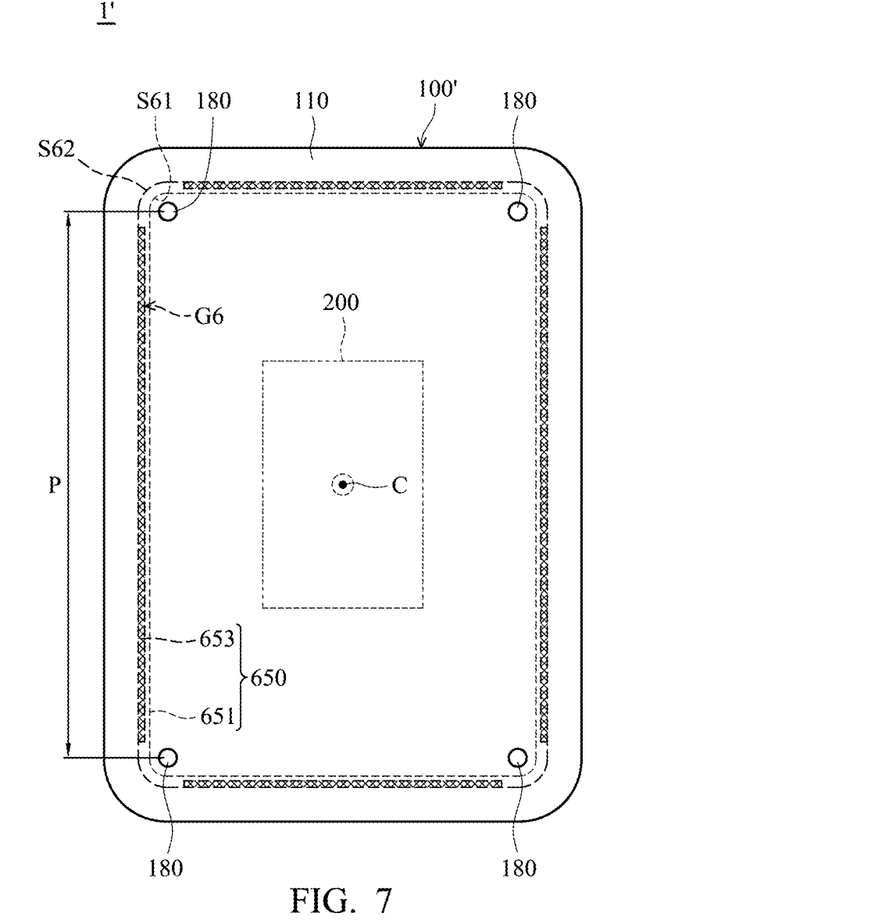
FIG. 7 is a top view of an electronic device according to an embodiment of the invention.

Referring to FIG. 7, a top view of an electronic device 1' in accordance with the other embodiment is shown in FIG. 7, in which similar elements are provided with the same reference numbers, wherein the features of the similar elements are not reiterated in the interest of brevity. The electronic device 1' has a protective structure 100' and operation module 200. The protective structure 100' has a first housing member 110, a second housing member 130 (not shown in FIG. 7) and a sealing member 650.

The sealing member 650 includes a first structure 651 and a plurality of second structures 653. The first structure 651 circumferentially extends around an axis C and includes an inner lateral surface S61 and an outer lateral surface S62, wherein the inner lateral surface S61 is closer to the axis C than the outer lateral surface S62, and a plurality of grooves G6 are formed on the outer lateral surface S62. A plurality of second structures 653 are respectively disposed in the grooves G6, wherein the water absorption rates of each of the second structures 653 are greater than the water absorption rate of the first structure 651. Specifically, the grooves G6, formed on the outer lateral surface S62 of the first structure 651, are disposed at intervals P between each two screws 180. Therefore, sealing capacity of the protective structure 100' at regions between each two screws 180 is improved.

It is noted that after assembly of the protective structure, the sealing member may deform to a flat or substantially flat configuration. However, for the purpose of illustration, in the drawings set forth, the sealing members are shown in the state before being compressed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sealing member, comprising:
   a first structure, comprising a groove having an opening towards an outside of the sealing member; and
   a second structure, disposed in the groove, wherein the first structure comprises a first material, and the second structure comprises a second material, and a water absorption rate of the second material is greater than a water absorption rate of the first material.

2. The sealing member as claimed in claim 1, wherein the first structure circumferentially extends around an axis, and the first structure comprises an inner lateral surface and an outer lateral surface, and the inner lateral surface is closer to the axis than the outer lateral surface, and the groove is formed on the outer lateral surface.

3. The sealing member as claimed in claim 2, wherein the groove penetrates the first structure to connect the inner lateral surface to the outer lateral surface.

4. The sealing member as claimed in claim 2, wherein the groove surrounds the axis and extends along the outer lateral surface.

5. The sealing member as claimed in claim 2, wherein the first structure comprises a plurality of grooves, and the grooves are arranged at the outer lateral and separated apart from each other.

6. The sealing member as claimed in claim 1, wherein the second structure is deformable from a first configuration to a second configuration, in response to a moisture content thereof, and when the second structure is in the second configuration, a part of the second structure is outside of the groove.

7. The sealing member as claimed in claim 1, wherein the second structure is deformable from a first configuration to a second configuration, in response to a moisture content thereof, and the deformation of the second structure from the first configuration to the second configuration increases the width of the groove.

8. The sealing member as claimed in claim 1, wherein the first material comprises silicon resin, and the second material comprises a water absorption sponge or water absorption fibers.

9. An electronic device, comprising:
   a first housing member;
   a second housing member, facing the first housing member;
   an operation module, disposed in a space defined by the first housing member and the second housing member; and
   a sealing member, pressed by the first and the second housing members so as to prevent the entrance of particles from outer surroundings, wherein the sealing member comprises:
      a first structure, comprising a groove having an opening towards an outside of the sealing member; and
      a second structure, disposed in the groove, wherein the first structure comprises a first material, and the second structure comprises a second material, and the water absorption rate of the second material is greater than the water absorption rate of the first material.

10. The electronic device as claimed in claim 9, wherein the sealing member is disposed at a peripheral region of the space, and the first structure is closer to the space than the second structure.

* * * * *